(12) United States Patent
Pillarisetty et al.

(10) Patent No.: US 8,211,771 B2
(45) Date of Patent: Jul. 3, 2012

(54) MULTIPLE-GATE TRANSISTORS AND PROCESSES OF MAKING SAME

(75) Inventors: Ravi Pillarisetty, Portland, OR (US); Jack Kavalieros, Portland, OR (US); Marko Radosavljevic, Beaverton, OR (US); Benjamin Chu-Kung, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/216,569

(22) Filed: Aug. 24, 2011

(65) Prior Publication Data

US 2011/0312140 A1    Dec. 22, 2011

Related U.S. Application Data

(62) Division of application No. 12/221,802, filed on Aug. 6, 2008, now Pat. No. 8,063,447.

(51) Int. Cl.
*H01L 21/336* (2006.01)

(52) U.S. Cl. ........ 438/283; 439/179; 439/286; 257/366; 257/E29.158; 257/E29.165; 257/E29.264; 257/E29.275; 257/E29.319; 257/E29.421

(58) Field of Classification Search .................. None
See application file for complete search history.

(56) References Cited

U.S. PATENT DOCUMENTS

| | | |
|---|---|---|
| 6,961,807 B1 | 11/2005 | Hauck |
| 7,105,390 B2 | 9/2006 | Brask et al. |
| 2007/0069293 A1 | 3/2007 | Kavalieros et al. |
| 2007/0138533 A1 | 6/2007 | Dennard et al. |

OTHER PUBLICATIONS

Gopalakrishnan et al., "Impact Ionization MOS (I-MOS)—Part II, Experimental Results", IEEE transaction on ED, vol. 52, No. 1, Jan. 2005, pp. 77-84.
Gopalakrishnan et al., "Impact Ionization MOS (I-MOS)—Part I, Device and Circuit Simulation", IEEE transaction on ED, vol. 52, No. 1, Jan. 2005, pp. 69-76.
Doyle et al., "Tri-gate Fully-depleted CMOS Transistors: Fabrication, Design and Layout", Symposium on VLSI Technology, Tokyo, Japanese Society Applied Physics, 2003, pp. 133-134.

*Primary Examiner* — Charles Garber
*Assistant Examiner* — Yasser Abdelaziez
(74) *Attorney, Agent, or Firm* — John N. Greaves

(57) ABSTRACT

A microelectronic device includes a P-I-N (p+ region, intrinsic semiconductor, and n+ region) semiconductive body with a first gate and a second gate. The first gate is a gate stack disposed on an upper surface plane, and the second gate accesses the semiconductive body from a second plane that is out of the first plane.

18 Claims, 5 Drawing Sheets

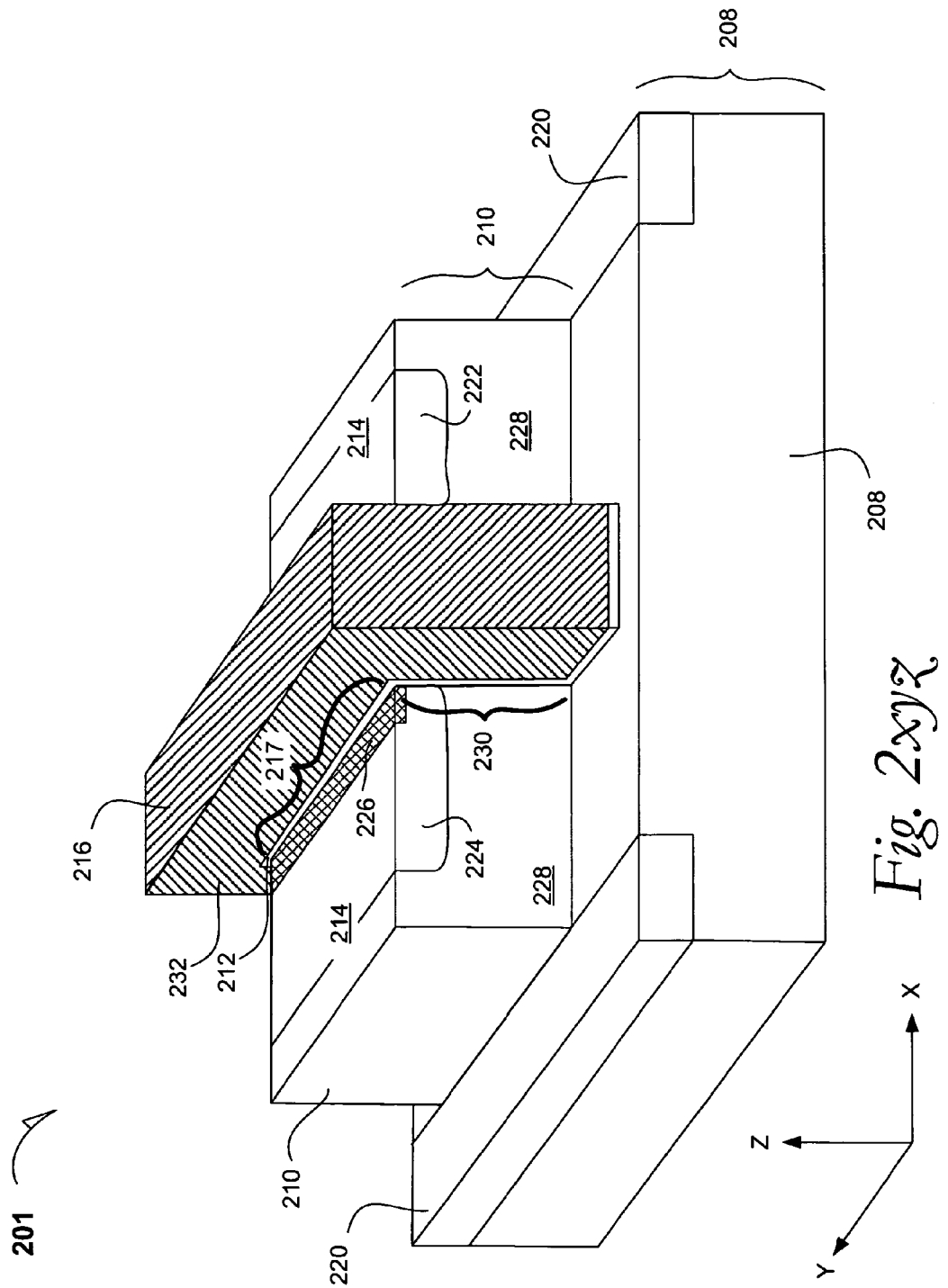
Fig. 2xyz

MULTIPLE-GATE TRANSISTORS AND PROCESSES OF MAKING SAME

RELATED APPLICATIONS

This is a Divisional of patent application Ser. No. 12/221,802, filed on Aug. 6, 2008.

TECHNICAL FIELD

Disclosed embodiments relate to semiconductive devices and processes of making them.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 2xyz is a perspective cut-away elevation of the transistor depicted in FIG. 2 according to an embodiment;

DETAILED DESCRIPTION

Reference will now be made to the drawings wherein like structures may be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the claimed structures of the illustrated embodiments. Moreover, the drawings show only the structures necessary to understand the illustrated embodiments. Additional structures known in the art have not been included to maintain the clarity of the drawings.

Figure 1A:
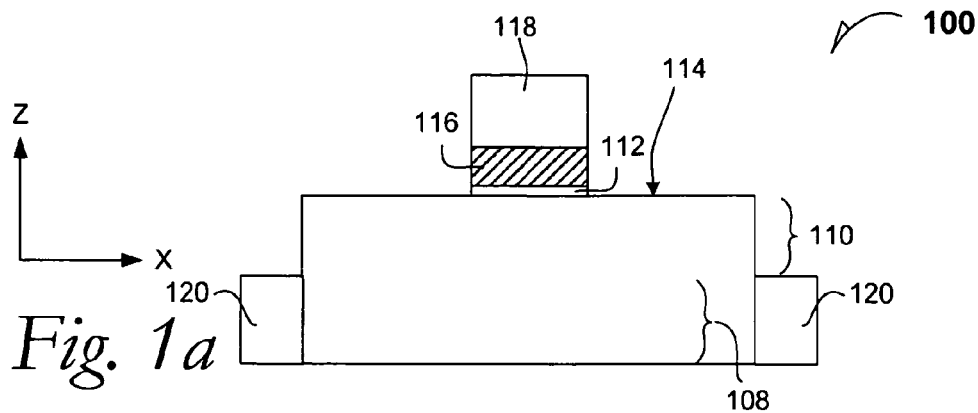
FIG. 1a is a cross-section elevation of a multi-gate field-effect transistor during processing according to an embodiment.

FIG. 1a is a cross-section elevation of a multi-gate field-effect transistor (MuGFET) 100 during processing according to an embodiment. The transistor 100 includes a semiconductive body 110 with a gate dielectric 112 disposed upon an upper surface plane 114 of the semiconductive body 110. A gate stack first gate 116 is disposed on the gate first dielectric 112, and a hard mask 118 is disposed on the gate stack first gate 116 according to an embodiment.

In an embodiment, the semiconductive body 110 is a prominence 110 that extends above a semiconductive substrate 108. Consequently, the semiconductive body 110 may be accessed by gate structure from more planes than the upper surface plane 114.

Figure 1B:
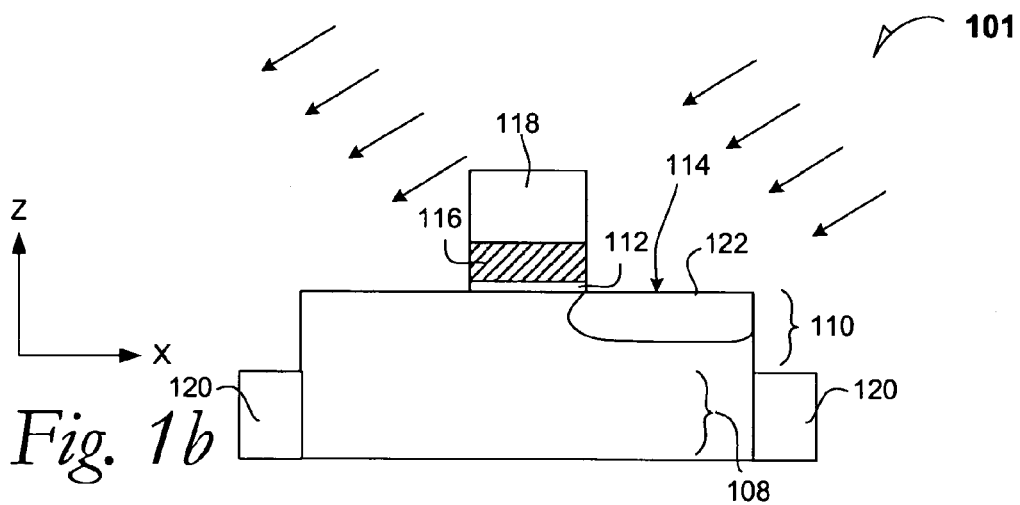
FIG. 1b is a cross-section elevation of the multi-gate field-effect transistor depicted in FIG. 1a after further processing according to an embodiment.

FIG. 1b is a cross-section elevation of the multi-gate field-effect transistor depicted in FIG. 1a after further processing according to an embodiment. The transistor 101 is depicted being angle-implanted, as indicated by angled right-to-left arrows, such that an n+ well 122 (also referred to as an n+ region 122) is being formed and the semiconductive body 110 is being shadowed by the hard mask 118 opposite the n+ well 122.

Figure 1C:
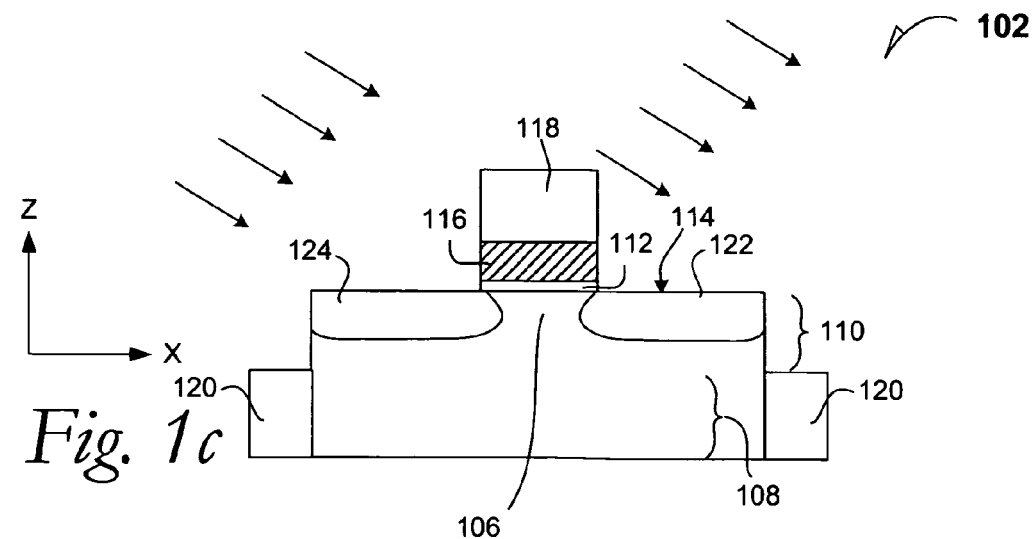
FIG. 1c is a cross-section elevation of the multi-gate field-effect transistor depicted in FIG. 1b after further processing according to an embodiment.

FIG. 1c is a cross-section elevation of the multi-gate field-effect transistor depicted in FIG. 1b after further processing according to an embodiment. The transistor 102 is depicted being angle-implanted, as indicated by angled left-to-right arrows, such that a p+ well 124 (also referred to as a p+ region 124) is being formed and the semiconductive body 110, particularly the n+ well 122 is being shadowed by the hard mask 118.

It can now be appreciated that formation of a P-I-N (p+, intrinsic semiconductor, and n+) semiconductive body 110 has been formed. The P-I-N semiconductive body 110 may also be referred to as an asymmetric junction 110 since, e.g., the source 124 is p+ doped and the drain 122 is n+ doped.

In an embodiment, the p+ well 122 and the n+ well 124 straddle an intrinsic semiconductor 106 such as undoped silicon. In an embodiment, the "intrinsic semiconductor" 106 is a p-doped silicon, but the doping is lightly doped compared to the resulting p+ well 124. In an embodiment, the I 106 of the P-I-N semiconductive body 110 is doped to a concentration that is less than one tenth that of p+ well 124. In an embodiment, the I 106 of the P-I-N semiconductive body 110 is doped to a concentration that is less than one one-hundredth that of p+ well 124. In an embodiment, the I 106 of the P-I-N semiconductive body 110 is doped to a concentration that is less than one one-thousandth that of p+ well 124. In an embodiment, the I 106 of the P-I-N semiconductive body 110 is doped to a concentration that is less than one ten-thousandth that of p+ well 124.

It can also be appreciated that processes other than angled, shadow implanting may be used for forming a P-I-N MuGFET. In an embodiment, a blanket implantation with the gate stack 116 present is carried out to dope both the source and the drain wells, followed by masking one of the wells with an over-doping of the exposed well to convert it to the opposite semi conductivity from that accomplished by the blanket implantation. Other process options may be done such as masking a first side and implanting the second side, followed by masking the second side and implanting the first side. Other processes may be done such as growing in situ doped epitaxial films; for example, by growing a P+ region followed by an N+ region, after respective undercut etching over each of the source- and drain wells. Other process options may be used for forming the P-I-N MuGFET.

Figure 2:
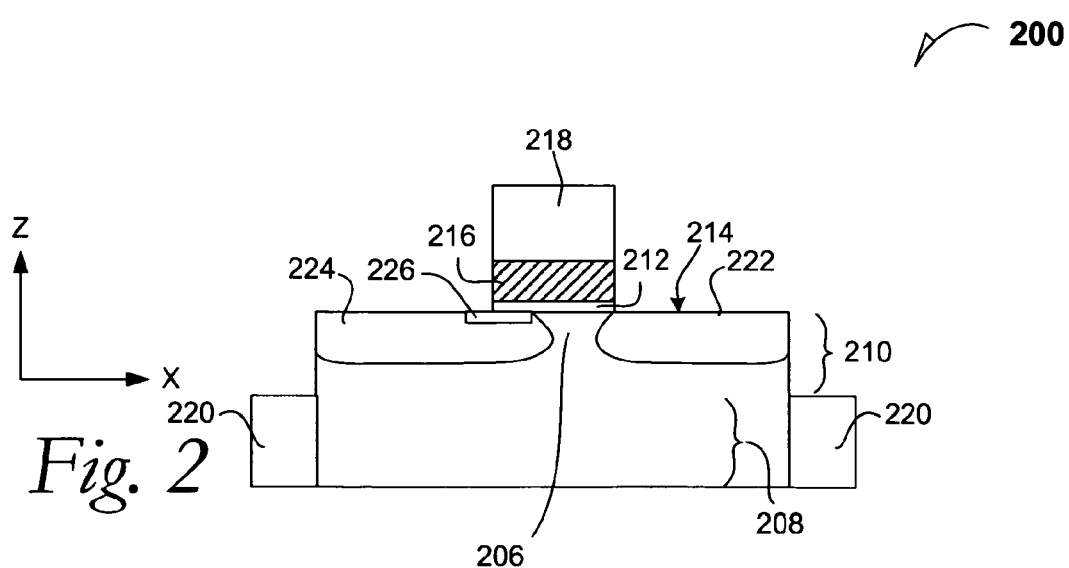
FIG. 2 is a cross-section elevation of a multi-gate field-effect transistor 200 according to an embodiment.

FIG. 2 is a cross-section elevation of a multi-gate field-effect transistor 200 according to an embodiment. The transistor 200 includes a semiconductive body 210 with a gate dielectric 212 disposed upon an upper surface plane 214 of the semiconductive body 210. A gate stack first gate 216 is disposed on the gate first dielectric 212, and a hard mask 218 is disposed on the gate stack first gate 216 according to an embodiment. The transistor 200 also includes an n+ well 222 (also referred to as an n+ region 222), an intrinsic semiconductor 206, and a p+ well 224 (also referred to as a p+ region 224). The intrinsic semiconductor 206 may be any doping embodiment set forth for the transistor 102 depicted in FIG. 1c.

An embedded n+ well 226 is also depicted in the semiconductive body 210, and particularly it is embedded in the n+ region 222 according to an embodiment. In an embodiment, the embedded n+ well 226 is partially disposed below the gate stack first gate 216. As illustrated, the embedded n+ well 226 may be about one-half disposed below the gate stack first gate 216. In an embodiment, the embedded n+ well 226 is less than one-half disposed below the gate stack first gate 216. In an embodiment, the embedded n+ well 226 is about one-third disposed below the gate stack first gate 216. In an embodiment, the embedded n+ well 226 is more than one-half disposed below the gate stack first gate 216. In an embodiment, the embedded n+ well 226 is about two-thirds disposed below the gate stack first gate 216. In an embodiment, the embedded n+ well 226 is disposed entirely below the gate stack first gate 216.

It may now be understood that the P-I-N structure may be reversed in the several disclosed embodiments. For example, an N-I-P structure may be manufactured that has an embedded p+ well in the N well.

In an embodiment, the semiconductive body 210 is a prominence 210 that extends above a semiconductive substrate 208. Consequently, the semiconductive body 210 may be accessed by gate structure from more planes than the upper surface plane 214.

FIG. 2xyz is a perspective cut-away elevation 201 of the transistor 200 depicted in FIG. 2 according to an embodiment. The transistor 200 includes the semiconductive body 210 with the gate dielectric 212 disposed upon the upper surface plane 214 of the semiconductive body 210. The gate dielectric 212 is also depicted as wrapping onto a front surface 228 of the semiconductive body 210 where it has formed prominence that extends above the semiconductive substrate 208.

As illustrated, the gate stack first gate 216 is disposed on the gate first dielectric 212 and it has an effective first gate length 217 across the upper surface plane 214. A second gate 230 is depicted disposed on the gate first dielectric as it wraps onto the front surface 228. The second gate 230 is also illustrated as an effective second gate length 230. Consequently, the second gate 230 is configured out of the upper surface plane 214; in this embodiment, it is configured orthogonally out of the upper surface plane 214. The second gate 230 may also be described as a longitudinal extension of the first gate 216 such that the second-gate dielectric film 212 is the gate dielectric first film 212 that is also below the gate stack first gate 216. Consequently, the second gate 230 affects the semiconductive body 210 from a surface that is orthogonal to the upper surface plane 214.

The transistor 200 also includes the n+ well 222, the p+ well 224, and the intrinsic semiconductor (which is obscured by the second gate 230 in this perspective). The embedded n+ well 226 is also depicted in the semiconductive body 210, and particularly it is embedded in the N region, also referred to as the n+ well 222 according to an embodiment.

The semiconductive body 210 is illustrated as a prominence 210 that extends above the semiconductive substrate 208. Consequently, the semiconductive body 210 may be accessed by the first gate 216, the second gate 230, and a third gate 232, which is depicted in part gate structure from more planes than the upper surface plane 214.

It can now be appreciated that the transistor 102 depicted in FIG. 1c may also be configured as a MuGFET 102 with a wrap-around second gate such as the second gate 230 depicted in FIG. 2xyz. Consequently, the second gate is configured out of the upper surface plane 114 of the semiconductive body 110.

It can also be appreciated that the transistor 201 is based upon a non-planar second gate. Consequently, the capacitive coupling to the intrinsic semiconductor 206 for a given Vcc is facilitated by the multiple gates for this assymetrical junction 210. This means an increased tunneling current through the intrinsic semiconductor 206 is achieved in the ON state. Further, a low-doped or undoped intrinsic semiconductor 206 with the assymetrical junction 210 results in a lower OFF state current in the transistor 201.

Figure 3:
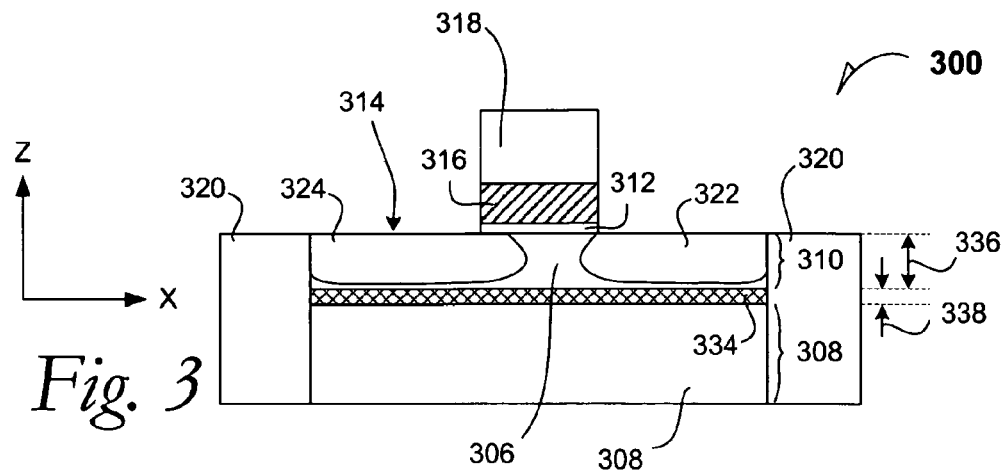
FIG. 3 is a cross-section elevation of a multi-gate field-effect transistor according to an embodiment.

FIG. 3 is a cross-section elevation of a multi-gate field-effect transistor 300 according to an embodiment. The transistor 300 includes a semiconductive body 310 with a gate dielectric 312 disposed upon an upper surface plane 314 of the semiconductive body 310. A gate stack first gate 316 is disposed on the gate first dielectric 312, and a hard mask 318 is disposed on the gate stack first gate 316 according to an embodiment. The transistor 300 also includes an n+ well 322 (also referred to as an n+ region 322), an intrinsic semiconductor 306, and a p+ well 324 (also referred to as a p+ region 324). The intrinsic semiconductor 306 may be any doping embodiment set forth for the transistor 102 depicted in FIG. 1c.

In an embodiment, the semiconductive body 310 may be accessed by gate structure from more planes than the upper surface plane 314. In an embodiment, a second gate 308 is a bulk semiconductive material that is disposed attitudinally below the P-I-N MuGFET that includes the a p+ well 324, the intrinsic semiconductor 306, and the n+ well 322. The second gate 308 is separated by the P-I-N MuGFET by a buried dielectric layer 334. In an embodiment, the buried dielectric layer 334 is a buried oxide layer 334. In an embodiment, the buried oxide layer 334 is formed by using conventional layer transfer techniques. These techniques may be applied to semiconductive materials such as monocrystalline, epitaxial, or polycrystalline silicon.

Consequent to the formation of the second gate 308, the bulk semiconductive material just below the buried dielectric layer 334 acts as a back gate 308 to the P-I-N MuGFET. During usage, the second gate 308 affects the semiconductive body 310 of the P-I-N MuGFET from a surface that is out of the plane of the upper surface plane 314; in this embodiment from below and parallel-planar to the upper surface plane 314.

In an embodiment, the channel depth 336 of the semiconductive body 310 is in a range from about 50 Angstron (Å) to about 100 Å. The channel depth for the transistors 102, 200, and 201 may also have the same depth range, as well as for the transistor 400 depicted in FIG. 4. In an embodiment, the buried dielectric layer 334 has a thickness, in the Z-dimension, in a range from about 5 Å to about 100 Å. The buried dielectric layer for the transistor 400 depicted in FIG. 4 may also have the same depth range. In an embodiment, the gate stack first gate 316 has a gate width 340 in a range from about 500 Å to about 10,000 Å. The gate widths for the gate stacks depicted in FIGS. 1c, 2, and 4 may also have the same width range.

Figure 4:
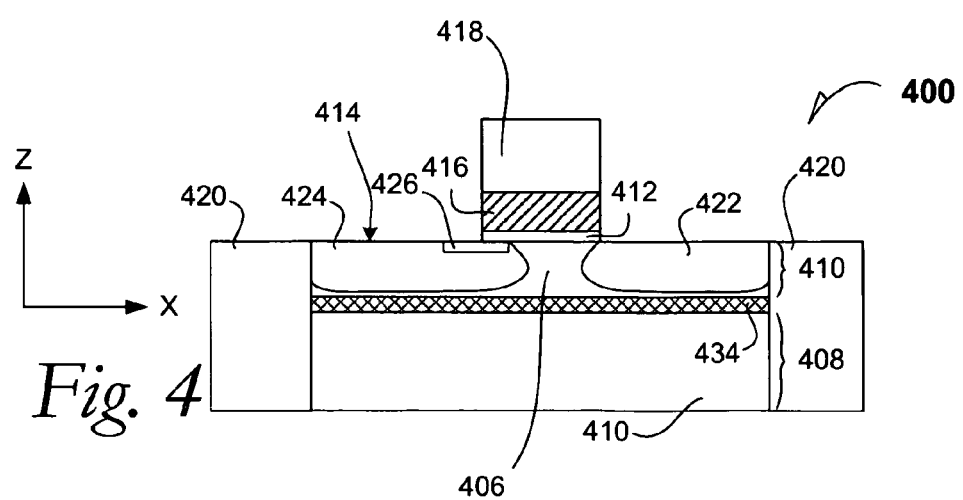
FIG. 4 is a cross-section elevation of a multi-gate field-effect transistor according to an embodiment.

FIG. 4 is a cross-section elevation of a multi-gate field-effect transistor 400 with an embedded n+ region in a p+ well according to an embodiment. The transistor 400 includes a semiconductive body 410 with a gate dielectric 412 disposed upon an upper surface plane 414 of the semiconductive body 410. A gate stack first gate 416 is disposed on the gate first dielectric 412, and a hard mask 418 is disposed on the gate stack first gate 416 according to an embodiment. The hard mask 418 may be present to effect angle-implanted formation of the source and drain wells in the semiconductive body 410.

The transistor 400 also includes an n+ well 422 (also referred to as an n+region 422), an intrinsic semiconductor 406, and a p+ well 424 (also referred to as a p+ region 424). The intrinsic semiconductor 406 may be any doping embodiment set forth for the transistor 102 depicted in FIG. 1c. An embedded n+ region 426 is depicted embedded within the p+ well 424 according to an embodiment.

In an embodiment, the semiconductive body 410 may be accessed by gate structures from more planes than the upper surface plane 414. In an embodiment, a second gate 408 is a bulk semiconductive material that is disposed attitudinally below the semiconductive body 410 that includes the p+ well 424, the intrinsic semiconductor 406, the embedded n+ region 426, and the n+ well 422. The second gate 408 is separated by the semiconductive body 410 by a buried dielectric layer 434. In an embodiment, the buried dielectric layer 434 is a buried oxide layer 434 that is formed by using conventional layer transfer techniques. These techniques may be applied to semiconductive material such as monocrystalline, epitaxial, or polycrystalline silicon.

Consequent to the formation of the second gate 408, the bulk semiconductive material 408 just below the buried dielectric layer 434 acts as a back gate 408 to a P-I-N MuGFET 400. During usage, the second gate 408 affects the semiconductive body of the P-I-N MuGFET 400 from a surface that is out of the plane of the upper surface plane 414, in this embodiment from below and parallel-planar to the upper surface plane 414.

It can now be appreciated that the P-I-N MuGFET 400 depicted in FIG. 4 may be combined with the longitudinally extending first gate 216 and the second gates 230 and 232 depicted in FIG. 2xyz to achieve up to four gates. Consequently each additional gate to the gate stack first gate 416 is configured out of the upper surface plane 414 of the semiconductive body 410.

For terminology of this embodiment, the MuGFET 400 depicted in FIG. 4 includes a gate stack first gate 416 and a first subsequent gate 408 that is the back gate 408. By combination of the second gates 230, and 232 depicted in FIG. 2xyz as they are projected onto FIG. 4, are referred to for terminology as second subsequent gate 230 and a third subsequent gate 232.

A process flow is described according to an embodiment.

The process includes forming a first region of a semiconductive body that includes a gate stack disposed thereon.

The process includes forming a second region of the semiconductive body under conditions where the first region is on the gate stack at a first side and the second region is at the gate stack at a second side. As a result of forming the first region and the second region, the first region and the second region form a P-I-N (p+, intrinsic semiconductor, n+) semiconductive body including an upper surface plane.

The process may include forming an embedded doped region in the one of the first or second regions. The embedded doped region is doped oppositely that of the region into which it is embedded.

The process includes forming a second gate configured out of the upper surface plane.

The process includes forming at least one subsequent second gate. In an non-limiting embodiment, a gate stack first gate 216 is added to by a second gate 230 and a subsequent second gate 232.

Figure 5:
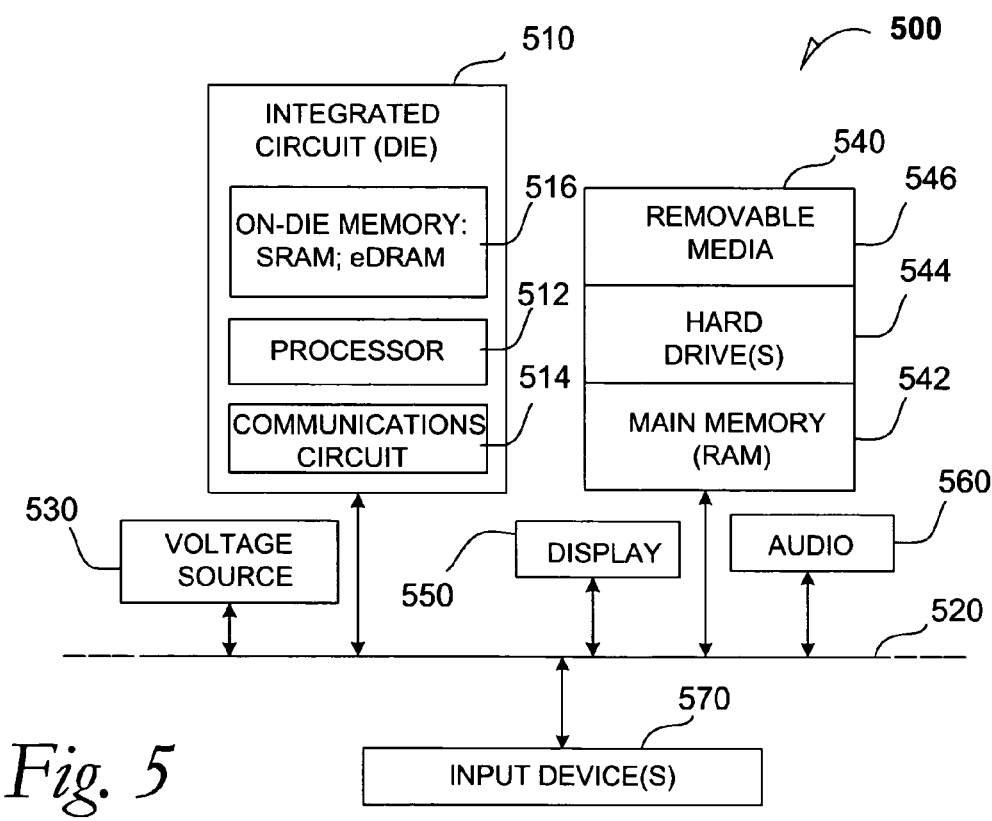
FIG. 5 is a schematic of an electronic system according to an embodiment.

FIG. 5 is a schematic of an electronic system 500 according to an embodiment. The electronic system 500 as depicted can embody a MuGFET P-I-N semiconductive body with a first gate and at least a second gate out of the plane of the first gate as set forth in this disclosure. In an embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 530 supplies current to the integrated circuit 510 through the system bus 520.

The integrated circuit 510 is electrically coupled to the system bus 520 and includes any circuit, or combination of circuits according to an embodiment. In an embodiment, the integrated circuit 510 includes a processor 512 that can be of any type. As used herein, the processor 512 may mean any type of circuit such as, but not limited to, a microprocessor, a microcontroller, a graphics processor, a digital signal processor, or another processor. Other types of circuits that can be included in the integrated circuit 510 are a custom circuit or an application-specific integrated circuit (ASIC), such as a communications circuit 514 for use in wireless devices such as cellular telephones, pagers, portable computers, two-way radios, and similar electronic systems. In an embodiment, the processor 510 includes on-die memory 516 such as static random-access memory (SRAM). In an embodiment, the processor 510 includes embedded on-die memory 516 such as embedded dynamic random-access memory (eDRAM).

In an embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory keys, and other removable media known in the art.

In an embodiment, the electronic system 500 also includes a display device 550, an audio output 560. In an embodiment, the electronic system 500 includes a controller 570, such as a keyboard, mouse, trackball, game controller, microphone, voice-recognition device, or any other device that inputs information into the electronic system 500.

As shown herein, the integrated circuit 510 can be implemented in a number of different embodiments, including a MuGFET P-I-N semiconductive body with a first gate and at least a second gate out of the plane of the first gate, an electronic system, a computer system, one or more methods of fabricating an integrated circuit, and one or more methods of fabricating an electronic assembly that includes a MuGFET P-I-N semiconductive body with a first gate and at least a second gate out of the plane of the first gate as set forth herein in the various embodiments and their art-recognized equivalents. The elements, materials, geometries, dimensions, and sequence of operations can all be varied to suit particular packaging requirements.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
   forming a first region of a semiconductive body that includes a gate stack disposed thereon;
   forming a second region of the semiconductive body under conditions wherein the first region is on the gate stack at a first side and the second region is a the gate stack at a second side;
   wherein the first region and the second region from a P-I-N (p+, intrinsic semiconductor, n+) semiconductive body including an upper surface plane; and
   forming a second gate configured orthogonal to and below the upper surface plane, wherein the second gate is only separated from the I of the P-I-N semiconductive body by a second gate dielectric.

2. The process of claim 1, wherein forming the first region is carried out by angled first-implanting the semiconductive body by using a hard mask, and wherein forming the second region is carried out by angled second-implanting the semiconductive body under conditions to shadow the first region.

3. The process of claim 1, further including forming an embedded n+ region in the P of the P-I-N semiconductive body.

4. The process of claim 1, further including forming an embedded n+ region in the P of the P-I-N semiconductive body, and wherein the embedded n+ region is formed partially below the gate stack first gate.

5. The process of claim 1, wherein the P-I-N semiconductive body is a prominence that extends above a semiconductive substrate, wherein forming the gate stack wraps around a front surface and a back surface of the prominence.

6. The process of claim 1, further including forming a buried dielectric layer in bulk semiconductive material disposed attitudinally below the P-I-N semiconductive body.

7. The process of claim 1, wherein the intrinsic semiconductor is p-doped silicon that is formed with a lower p-doping concentration than the P of the P-I-N semiconductive body, the process further including:
   forming a buried dielectric layer below the P-I-N semiconductive body to separate the P-I-N semiconductive body from a bulk semiconductive material, and
   wherein the bulk semiconductive material has a p-doping that is different than the p-doped silicon of the intrinsic semiconductor.

8. The process of claim 1, wherein the second gate is formed of a semiconductive substrate disposed below a buried oxide layer that is disposed below the P-I-N semiconductive body, the process further including:
   forming an embedded doping in one of the p-doped first well or the n-doped second well, wherein the embedded doping is doped oppositely from the well in which it is disposed; and
   wherein the embedded doping is disposed partially below the gate stack.

9. A process comprising:
   forming a first region of a semiconductive body that includes a gate stack disposed thereon, wherein forming the first region is carried out by angled first-implanting the semiconductive body by using a hard mask;
   forming a second region of the semiconductive body under conditions wherein the first region is on the gate stack at a first side and the second region is a the gate stack at a second side, and wherein forming the second region is carried out by angled second-implanting the semiconductive body under conditions to shadow the first region;
   wherein the first region and the second region from a P-I-N (p+, intrinsic semiconductor, n+) semiconductive body including an upper surface plane, wherein the intrinsic semiconductor is p-doped silicon that is formed with a lower p-doping concentration than the P of the P-I-N semiconductive body;
   forming a second gate configured orthogonal to and below the upper surface plane, wherein the second gate is only separated from the I of the P-I-N semiconductive body by a second gate dielectric; and
   forming a buried dielectric layer below the P-I-N semiconductive body to separate the P-I-N semiconductive body from a bulk semiconductive material, and
   wherein the bulk semiconductive material has a p-doping that is different than the p-doped silicon of the intrinsic semiconductor.

10. The process of claim 9, further including forming an embedded n+ region in the P of the P-I-N semiconductive body.

11. The process of claim 9, further including forming an embedded n+ region in the P of the P-I-N semiconductive body, and wherein the embedded n+ region is formed partially below the gate stack fir st gate.

12. The process of claim 9, wherein the P-I-N semiconductive body is a prominence that extends above a semiconductive substrate, wherein forming the gate stack wraps around a front surface and a back surface of the prominence.

13. The process of claim 9, further including forming a buried dielectric layer in bulk semiconductive material disposed attitudinally below the P-I-N semiconductive body.

14. A process comprising:
   forming a first region of a semiconductive body that includes a gate stack disposed thereon, wherein forming the first region is carried out by angled first-implanting the semiconductive body by using a hard mask;
   forming a second region of the semiconductive body under conditions wherein the first region is on the gate stack at a first side and the second region is a the gate stack at a second side, and wherein forming the second region is carried out by angled second-implanting the semiconductive body under conditions to shadow the first region;
   wherein the first region and the second region from a P-I-N (p+, intrinsic semiconductor, n+) semiconductive body including an upper surface plane, wherein the intrinsic semiconductor is p-doped silicon that is formed with a lower p-doping concentration than the P of the P-I-N semiconductive body;
   forming a second gate configured orthogonal to and below the upper surface plane, wherein the second gate is only separated from the I of the P-I-N semiconductive body by a second gate dielectric, wherein the second gate is formed of a semiconductive substrate disposed below a buried oxide layer that is disposed below the P-I-N semiconductive body;
   forming an embedded doping in one of the p-doped first well or the n-doped second well, wherein the embedded doping is doped oppositely from the well in which it is disposed; and wherein the embedded doping is disposed partially below the gate stack.

15. The process of claim 14, further including forming an embedded n+ region in the P of the P-I-N semiconductive body.

16. The process of claim 14, further including forming an embedded n+ region in the P of the P-I-N semiconductive body, and wherein the embedded n+ region is formed partially below the gate stack first gate.

17. The process of claim 14, wherein the P-I-N semiconductive body is a prominence that extends above a semiconductive substrate, wherein forming the gate stack wraps around a front surface and a back surface of the prominence.

18. The process of claim 13, further including forming a buried dielectric layer in bulk semiconductive material disposed attitudinally below the P-I-N semiconductive body.

* * * * *